US010219381B2

(12) United States Patent
Lydecker

(10) Patent No.: US 10,219,381 B2
(45) Date of Patent: Feb. 26, 2019

(54) CIRCUIT BOARD MOUNTED SWITCH WITH ELECTRO STATIC DISCHARGE SHIELD

(71) Applicant: Carling Technologies, Inc., Plainville, CT (US)

(72) Inventor: Adam Charles Lydecker, Burlington, CT (US)

(73) Assignee: Carling Technologies, Inc., Plainville, CT (US)

( * ) Notice: Subject to any disclaimer, the term of this patent is extended or adjusted under 35 U.S.C. 154(b) by 0 days.

(21) Appl. No.: 15/465,889

(22) Filed: Mar. 22, 2017

(65) Prior Publication Data

US 2018/0279477 A1 Sep. 27, 2018

(51) Int. Cl.
| H05K 1/02 | (2006.01) |
| H05K 1/18 | (2006.01) |
| H01H 23/00 | (2006.01) |
| H01H 23/04 | (2006.01) |
| H01H 23/12 | (2006.01) |

(52) U.S. Cl.
CPC .......... H05K 1/181 (2013.01); H01H 23/006 (2013.01); H01H 23/04 (2013.01); H01H 23/12 (2013.01); H05K 1/0259 (2013.01); H01H 2239/008 (2013.01); H05K 2201/10053 (2013.01); H05K 2201/10424 (2013.01)

(58) Field of Classification Search
CPC .......... H01H 23/006; H01H 2239/008; H05K 9/0067; H05K 2201/10371; H05K 2201/10052; H05K 2201/10424; H05K 1/181; H05K 1/0259
See application file for complete search history.

(56) References Cited

U.S. PATENT DOCUMENTS

| 4,456,800 | A | 6/1984 | Holland |
| 5,107,082 | A | 4/1992 | Valenzona |
| 5,705,860 | A | 1/1998 | Ninh et al. |
| 6,058,000 | A | 5/2000 | Koenck et al. |
| 6,483,719 | B1 | 11/2002 | Bachman |
| 6,624,432 | B1 | 9/2003 | Gabower et al. |
| 6,643,918 | B2 | 11/2003 | Ortiz et al. |
| 6,997,722 | B2 | 2/2006 | Mangold |
| 7,342,193 | B2 * | 3/2008 | Chang ............... H01H 13/70 200/304 |
| 7,567,419 | B2 | 7/2009 | Lu et al. |
| 7,609,501 | B2 | 10/2009 | Anthony et al. |
| 7,652,895 | B2 | 1/2010 | Verweg et al. |
| 7,948,732 | B2 | 5/2011 | Su et al. |
| 8,008,589 | B2 | 8/2011 | Grundmeier |

(Continued)

FOREIGN PATENT DOCUMENTS

WO 200019791 A1 4/2000

*Primary Examiner* — Vanessa Girardi
(74) *Attorney, Agent, or Firm* — Forge IP, PLLC

(57) ABSTRACT

An Electro Static Discharge protection device that is provided to protect sensitive electronics on a Printed Circuit Board (PCB) from inadvertent electrical discharge. The protective device is formed as an intervening structure between a contact surface and a PCB and utilizing the same ground as used by the PCB. When an electrical discharge occurs, the discharge is directed toward the PCB and directed to at least one ground point on the PCB so as to avoid damage to sensitive components.

19 Claims, 5 Drawing Sheets

(56) References Cited

U.S. PATENT DOCUMENTS

| | | | |
|---|---|---|---|
| 8,089,772 B2* | 1/2012 | Chen | H04M 1/236 174/520 |
| 8,710,376 B2 | 4/2014 | Malek et al. | |
| 8,885,355 B2* | 11/2014 | Stanley | H05K 5/0013 200/237 |
| 9,072,161 B2 | 6/2015 | He et al. | |
| 9,155,188 B2 | 10/2015 | Merz et al. | |
| 9,254,588 B1 | 2/2016 | Chao et al. | |
| 9,272,471 B2 | 3/2016 | Colahan et al. | |
| 2007/0115605 A1 | 5/2007 | Pekkarinen et al. | |
| 2009/0190277 A1 | 7/2009 | Hiew et al. | |
| 2009/0277760 A1 | 11/2009 | Grundmeier | |
| 2010/0099501 A1 | 4/2010 | Blair et al. | |
| 2011/0255250 A1 | 10/2011 | Dinh et al. | |
| 2013/0308787 A1 | 11/2013 | Stanley et al. | |
| 2015/0216024 A1 | 7/2015 | Kwong | |
| 2016/0242331 A1 | 8/2016 | Park et al. | |

\* cited by examiner

CIRCUIT BOARD MOUNTED SWITCH WITH ELECTRO STATIC DISCHARGE SHIELD

FIELD OF THE INVENTION

The invention relates to protecting electronic components from inadvertent Electro Static Discharge, and more particularly, to protecting the components on a Printed Circuit Board in an electronic device, such as a switch, from Electro Static Discharge by controlling the direction of the current path taken during a discharge occurrence to direct the discharge to a ground used by the Printed Circuit Board.

BACKGROUND OF THE INVENTION

Electrostatic Discharge (ESD) is often described as the flow of electricity between two electrically charged objects. ESD may occur when differently-charged objects are brought close together and may include the creation of a visible spark. One example of ESD is the discharge of static electricity when a person touches an electrically conductive object.

ESD is a major problem faced by electronic manufacturers that sell semi-conductor devices. Semi-conductor devices are typically sensitive to the presence of static electricity and inadvertent discharge can result in severe damage to the electronics. For example, in looking at the effect of ESD on electronic devices, a human being can be represented as a capacitor (an electrical storage device) of 100 pF and may be charged to a voltage of from 4,000 to 35,000 volts. When the person touches an object, this stored energy may be discharged through the object. While the energy that is transmitted is typically very small, the voltage can still damage sensitive electronics.

It is virtually impossible to protect against any and all levels of ESD, however, two general approaches have been taken to deal with this problem.

A first approach is to increase the length that an arc must travel to reach an underlying Printed Circuit Board (PCB) including sensitive electronic components, such that the voltage required to bridge the air gap must be relatively large. Therefore, the simplest way to provide protection against ESD to some threshold is to keep the PCB as far from a potential discharge source as is possible. This approach is limited in effectiveness due to the structural limitations of where the PCB can be placed relative to the ESD potential.

As second approach has been to provide an insulated barrier that seeks to protect the PCB. For example, if a barrier of solid plastic were placed between the PCB and a potential discharge source, the path for the potential ESD would have significantly more resistance than an air gap.

Both of these solutions seek to prevent any and all ESD from reaching the PCB by increasing the resistance to ground such that it becomes difficult for ESD to occur through the device. However, with the very high voltages that can occur (up to 35,000 volts), this approach has had limited success as the insulting material required to prevent a discharge at such a high potential become unwieldly and very expensive in relation to the relatively low cost of the component that it is supposed to protect. Likewise, the air gap distances required for effective insulation are too large for practical implementation especially in relatively small spaces, the size of the component cannot be increased to a size necessary to prevent all ESD. The result has been that, while some ESD has been prevented, the devices are still subject to damage caused by high ESD voltages. The end result being a damaged or destroyed electronic components.

Other ideas have sought to completely direct the ESD away from the device, in effect, providing a low resistance path that carries the electrical power away from sensitive components. For example, U.S. Pat. No. 8,008,589 (the '589 patent) discloses an electrical switching device including an anti ESD device. The '589 patent teaches "providing on a surface of the electrical switching device an electrically conductive element" where "an electrical charge at a fingertip of the user is, due to the higher electrical conductivity, always transferred to the metallic element and does not penetrate the plastic surface." Col. 2, ll. 1-3 & 8-11. The '589 patent further teaches that "an earth connection which can be designed as desired and via which the electrical charge is carried away in a focused manner" such that "damage to the actual electrical or electronic switching device is effectively avoided, as the charge is not introduced into a delicate circuit of the electrical switching device." Col. 2, ll. 11-18. In particular, the '589 patent teaches that the "metallic element reliably guarantees that no electrical charge penetrates for example a plastic surface of the electrical switching device uncontrolled and damages a circuit." Col. 2, ll. 28-30.

However, a limitation of the '589 patent is that it seeks to again, prevent or stop any ESD from reaching the printed circuit board (PCB) that it is seeking to protect, which is just not possible. The critical feature of the '589 patent is that "the electrical charge is carried away from the ring 4 via the earth connection." Col. 4, ll. 48-49. While the '589 patent may help to reduce the frequency of which ESD reaches the PCB, this configuration can't stop all of it. The electronics on a PCB are electronic in nature and inherently utilize electrical pathways. The very nature of the PCB has a tendency to draw electricity toward it to find a pathway to ground. Likewise, very high voltage can travel along unexpected paths depending on environmental and atmospheric conditions. While it is possible to provide a pathway to direct ESD away from sensitive electronics, it is simply not possible to fully control the path of ESD under many varying conditions. Discharge to the PCB with this system will still result in damage to sensitive electronics.

U.S. Pat. No. 9,072,161 (the '161 patent) is another system that seeks to prevent any ESD from reaching the PCB. As was stated previously, this is virtually impossible to do in a consistent and reliable manner. For example, the '161 patent teaches use of an "Electro-Static shielding layer located on an upper surface of the base layer and can at least covering sensitive areas . . . and an insulating layer for at least covering the Electro-Static shielding layer." Col. 2, ll. 18-22. The '161 patent will suffer from the same problem as the '589 patent in that, it is just not possible to fully prevent any ESD from reaching the PCB even if a shielding is provided over top the of various parts of the PCB and designed to carry charge away from the sensitive electronics.

U.S. Patent Application Publication No. 2016/0242331 (the '331 application) is yet another system that seeks to protect a PCB from ESD. The '331 application takes the same flawed approach as the previous designs, namely, "preventing the infiltration of ESD into the inside of the PCB." Para. 123.

What is needed then is a system that provides enhanced ESD protection that does not suffer from the problems discussed above.

SUMMARY OF THE INVENTION

Accordingly, it is an object of the present invention to provide a system to prevent damage from occurring to the components of a PCB due to ESD.

It is another object of the present invention to provide a system that directs ESD toward the PCB, as opposed to away from the PCB as taught in known systems.

It is still another object of the present invention to provide a system that provides a pathway on the PCB itself for ESD to reach the same ground used by the PCB so as to avoid damage to any sensitive electronics on the PCB.

In one configuration, a switch is provided that includes a mechanical component that is used to direct ESD to controlled points on a PCB associated with the switch.

It is understood that electricity will take a path of least electrical resistance. However, the electrical resistance of a path can change based on a number of factors including, environmental and atmospheric conditions. This is one of the reasons that prior systems that sought to totally prevent any ESD from reaching the PCB have been of limited effectiveness. As such, the present invention seeks to draw any ESD toward the PCB and provide a pathway for the electrical current on the PCB itself to the same ground used by the PCB.

ESD is drawn toward the PCB by a metal component (an ESD device) that is fitted around the PCB and has "legs" that extend downward toward contact points on the PCB. In certain switch configurations, the PCB has to be mounted relatively close to the top of the switch. This means that the distance from where the ESD starts (where the individual touches the top of the switch) to the PCB itself may be too small to prevent ESD (arcing) in all conditions. It will be understood that the ESD device may be mechanically fitted together with other components when the switch is assembled. The ESD device is positioned above the PCB to form an intervening structural component to "catch" any ESD originating from the contact surface and draws the electrical energy toward specific locations on the PCB so as to be dissipated through the ground connection used by the electronics on the PCB. In practice it has been observed that the level of protection exceeds 30 kV due to the structure and path of travel for the ESD.

A primary advantage of the configuration is that is allows for the PCB to be positioned very close to the top of the switch where a person would actually touch the switch to operate it. A very high level of ESD protection is available despite the lack of distance from the ESD surface or the use of a robust intervening insulation material.

In some configurations the electronic device is provided as an electronic switch that includes a PCB with fitted into a base comprising a plastic material. The electronic switch may also include an activation mechanism (also formed of a plastic material) that is provided to be moved into contact with the PCB to actuate the switch. The ESD device may be fitted around or over top of the activation mechanism and a cover is then fitted over top of the electronic switch. In this configuration it is contemplated that the cover may mechanically interlock with the base.

The specific configuration of the ESD device can vary depending on the configuration of the PCB. However, when the PCB is generally rectangular in shape, it is important for the ESD to extend at least along a portion of a longitudinal length of the PCB. The ESD device will typically include a frame that will extend around a perimeter of a contact surface on the top of the cover such that when a person touches the contact surface, if an electro static discharge occurs, the electrical current is drawn toward the ESD device. As the ESD device is made of a metal material, this will present a near zero ohm resistance to the electrical current as at least one leg will extend from the frame directly toward a ground point used by the PCB. In this manner, electro static discharge is drawn to the ESD device and directed to the PCB ground. Regardless of the environmental condition, the ground used for the ESD device is the PCB ground, which eliminates the ability for the charge to skip to the PCB itself to travel through and damage electronics on the PCB.

For this application the following terms and definitions shall apply:

The terms "first" and "second" are used to distinguish one element, set, data, object or thing from another, and are not used to designate relative position or arrangement in time.

The terms "coupled", "coupled to", "coupled with", "connected", "connected to", and "connected with" as used herein each mean a relationship between or among two or more devices, apparatus, components, systems, subsystems, and/or means, constituting any one or more of (a) a connection, whether direct or through one or more other devices, components, systems, subsystems, or means, (b) a communications relationship, whether direct or through one or more other devices, apparatus, components, systems, subsystems, or means, and/or (c) a functional relationship in which the operation of any one or more devices, components, systems, subsystems, or means depends, in whole or in part, on the operation of any one or more others thereof.

In one configuration, an electronic device capable of capturing and directing electro-static discharge is provided comprising: a printed circuit board including electronics positioned thereon, an actuation surface having a perimeter and configured to be contacted to actuate the electronic device, and an electro static discharge device comprising a frame extending around the perimeter of the actuation surface, the electro static discharge device including at least one leg extending from the frame and contacting the printed circuit board. The electronic device is provided such that a distal end of the at least one leg is positioned adjacent to a ground connection used by the printed circuit board, and in the event an object contacts the actuation surface and an electro static discharge occurs, the electro static discharge is drawn to the frame of the electro static discharge device and down the at least one leg to the ground connection of the PCB.

In another configuration an electronic switch capable of capturing and directing electro-static discharge is provided comprising: a printed circuit board including electronics positioned thereon, a base within which the PCB is held, and a cover including an actuation surface having a perimeter and configured to be contacted to actuate the electronic switch. The electronic switch further comprises an activation mechanism extending between the cover and the PCB and axially moveable toward the PCB, wherein when the actuation surface is depressed, the activation mechanism is moved toward the PCB to activate the switch, and an electro static discharge device comprising a frame extending around the perimeter of the actuation surface and fitted over the activation mechanism, the electro static discharge device including at least one leg extending from the frame and contacting the printed circuit board. The electronic switch is provided such that the at least one leg is in electrical contact with a ground connection used by the printed circuit board, and in the event an object contacts the cover and an electro static discharge occurs, the electro static discharge is drawn to the frame of the electro static discharge device and down the at least one leg to the ground connection of the PCB.

Other objects of the invention and its particular features and advantages will become more apparent from consideration of the following drawings and accompanying detailed description.

DETAILED DESCRIPTION OF THE INVENTION

Figure 1:
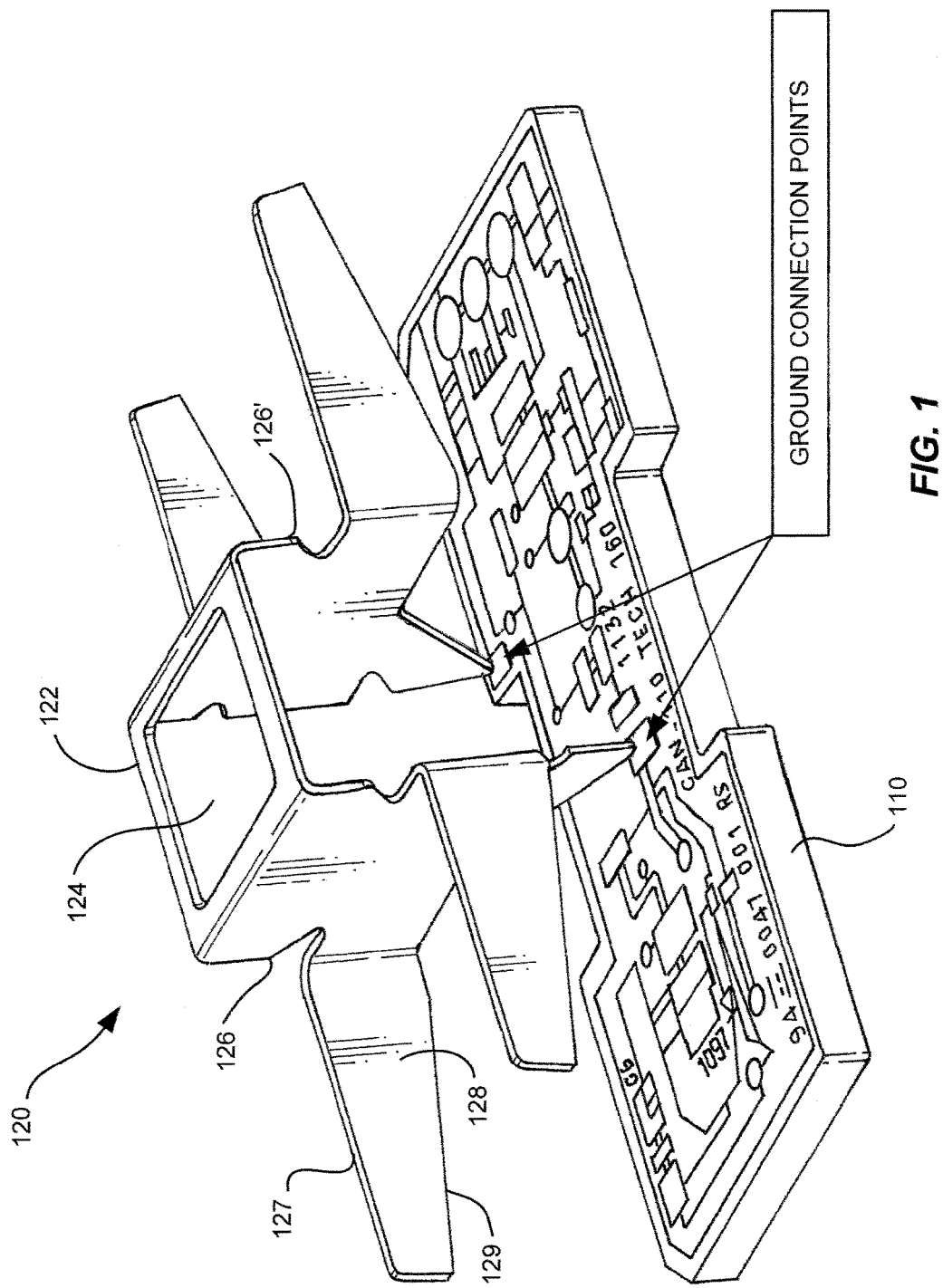
FIG. 1 is an illustration of the ESD component that is placed over a PCB to draw an ESD toward the PCB so that it can be dissipated.

Referring now to the drawings, wherein like reference numerals designate corresponding structure throughout the views.

Figure 2:
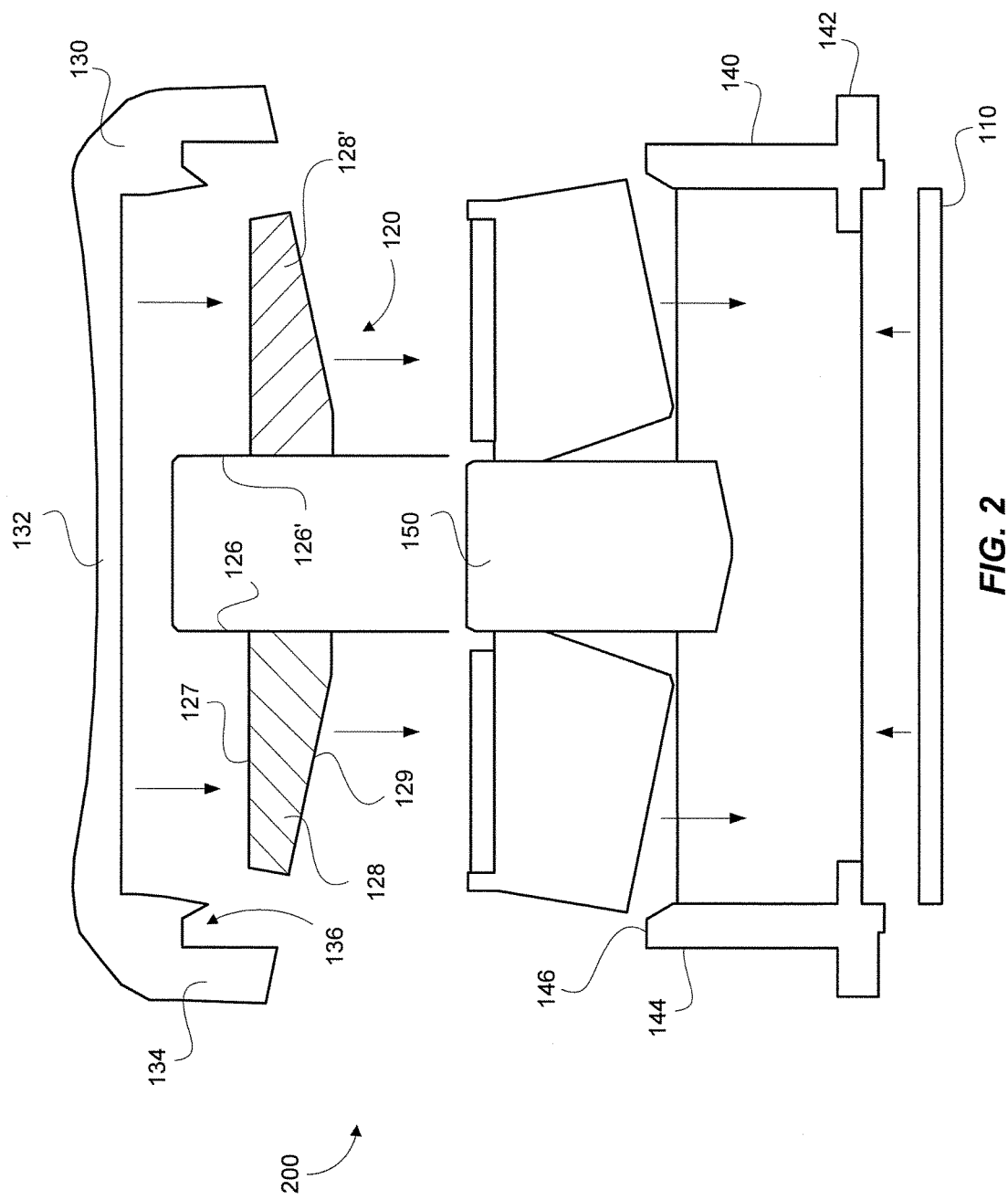
FIG. 2 is an exploded view of a switch device using the ESD component according to FIG. 1.

FIG. 1 is an illustration of showing how an ESD device 120 (a metal component) is placed over, in an intervening fashion, PCB 110. FIG. 2 is an exploded view of an electronic rocker switch 200 that may use the ESD device 120, which FIG. 3 is an assembled view of the electronic rocker switch 200.

FIG. 1 generically illustrates how the ESD device 120 may be configured and positioned relative to the PCB 110. While the structure, function and operation of the ESD device 120 will be discussed in connection with an electronic rocker switch 200, it will be recognized by those of skill in the art that there are many differing electronic devices that may effectively use the ESD device 120.

The following examples are presented to further illustrate and explain the present invention and should not be taken as limiting in any regard. Likewise, the illustrations and drawings are not provided to scale and are provided to further explain and illustrate the novel features of the invention.

Figure 3:
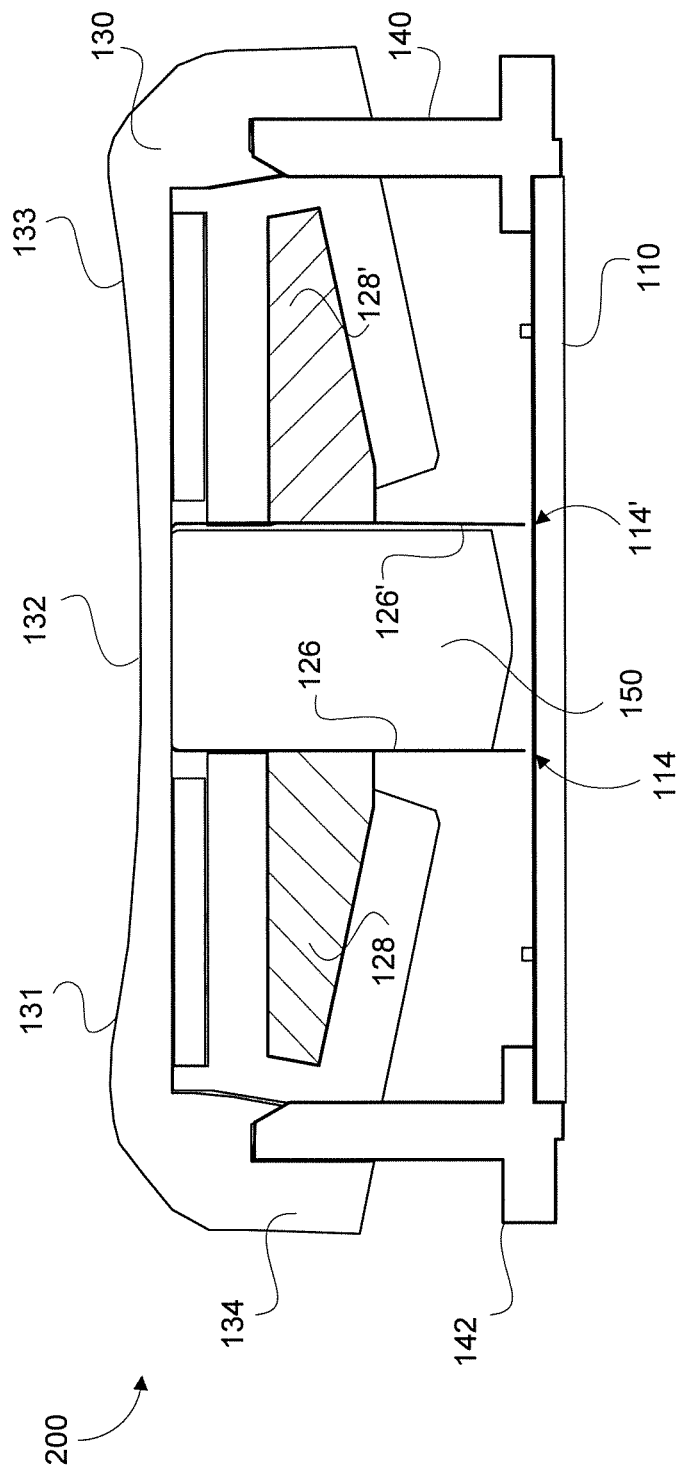
FIG. 3 is an assembled view of a switch device using the ESD component according to FIG. 2.

Referring to FIGS. 2 and 3, and electronic rocker switch 200 is shown. The electronic rocker switch 200 is capable of capturing and directing electro-static discharge that may occur due to, a person coming in contact with a contact surface 132 of the cover 130. As can be seen, a PCB 110 is fitted into a base 140. Base 140 may comprise a molded plastic material and may be provided with mounting protrusions 142 and side walls 144. In this manner, electronic rocker switch 200 may be mounted to a surface by a fastener, such as, for example, a screw, via the mounting protrusions 142.

The PCB 110 may comprise virtually any type of printed circuit board that includes electronics positioned in or on the structure. In one configuration, the PCB 110 is attached to base 140 by any well-known connection mechanism, including but not limited to, a snap connection, a friction fit, a fastener and so on.

Also shown in FIGS. 2 and 3 is activation mechanism 150. Activation mechanism 150 is positioned between PCB 110 and contact surface 132. In operation, a user may depress either a first portion 131 of contact surface 132, or a second portion 133 of contact surface 132. Depression of either side of contact surface 132 will cause the side depressed to pivot that side of activation mechanism 150 downward toward PCB 110 such that the rocker switch 200 is activated. The base 140 is molded to receive and hold activation mechanism 150. In particular, base 140 allows for activation mechanism 150 to pivot in a teeter-totter action such that either one side or the other of the rocker switch is activated.

The cover 130 is also formed of a malleable material and is designed including side walls 134 that engage with side walls 144 of base 140. In one configuration, side walls 134 each include a recess 136 for receiving a distal end 146 of side walls 144. The connection between the cover 130 and base 140 may comprise, for example, a protrusion engaging with an undercut or any other suitable connection method. Likewise, it is contemplated that upon connection of the cover with the base, a water tight seal may be formed, which may include the use of a seal (not shown).

Also shown more clearly seen in FIG. 1 is ESD device 120. ESD device 120 comprises a frame 122 that may, in one configuration, generally correspond in size to a central area of PCB 110. Frame 122 may also optionally include an opening 124. Extending from frame 122 is a first leg 126 and a second leg 126'. First and second legs 126, 126' are connected to opposite sides of frame 122 and extend generally parallel to each other and generally perpendicular to frame 122. It is contemplated that ESD device 120 may comprise a metal material that provides a very low resistance to electrical current.

Extending from first leg 126 are arms 128 that extend generally parallel to each other and generally perpendicular to first leg 126. As can be seen with reference to FIG. 1, ESD device 120 may be formed as a single, unitary construction. With reference to arms 128, each arm comprises a proximal end that is attached to first leg 126 and a distal end that terminates at a maximum distance from first leg 126. Looking at each arm 128, it can further be seen that an upper edge 127 defines an upper part of arm 128 and a lower edge 129 defines a lower part of arm 128. Additionally, the proximal ends of arms 128 are larger than the distal ends such that lower edge 129 is not parallel with upper edge 127. Another way to describe the configuration of the edges of arms 128 extending from a leg 126 is that that the upper edges 127 are coplanar with each other and the lower edges are coplanar with each other, however, the upper edges 127 are not coplanar with the lower edges 129.

First and second legs 126, 126' each extend downward from frame 122 toward PCB 110. Each of first and second legs 126, 126' terminates at a distal end that may comprise a point, where each is terminated adjacent to ground connection points 114, 114' respectively on PCB. It is contemplated that by using the same ground that is used by the PCB, this avoids the technique of trying to move an electro static discharge away from the PCB; but instead, draws the charge toward the PCB and to the same ground used by the PCB. As can be seen, the ends of first and second legs 126, 126' terminate short of actually physically contacting ground connection point 114, 114'. This allows for the pivoting of the switch assembly. Likewise, the ground connection points 114, 114' are physically separated from each other, but are maintained at the same potential being coupled to a common ground used by the PCB 110.

The ESD device 120, as stated previously, may comprise a metal material or an alloy. The material will be selected primarily to be a good electrical conductor as electro static discharge should see the ESD device 120 as an essentially zero ohm path of resistance for its length so as to draw any charge along the EDS device 120 to ground. The resistance should be calculated as the air resistance equal to the distance an electro static discharge must cross to reach EDS device 120. The positioning of EDS device 120 is provided to ensure that any path electro static discharge could take to the PCB would be much higher in resistance than the path to the EDS device 120.

Likewise, the base 140 and the activation mechanism 150 may all comprise a plastic, composite material and the cover 130 may also comprise a malleable material that is generally an electrical insulator.

Figure 4:
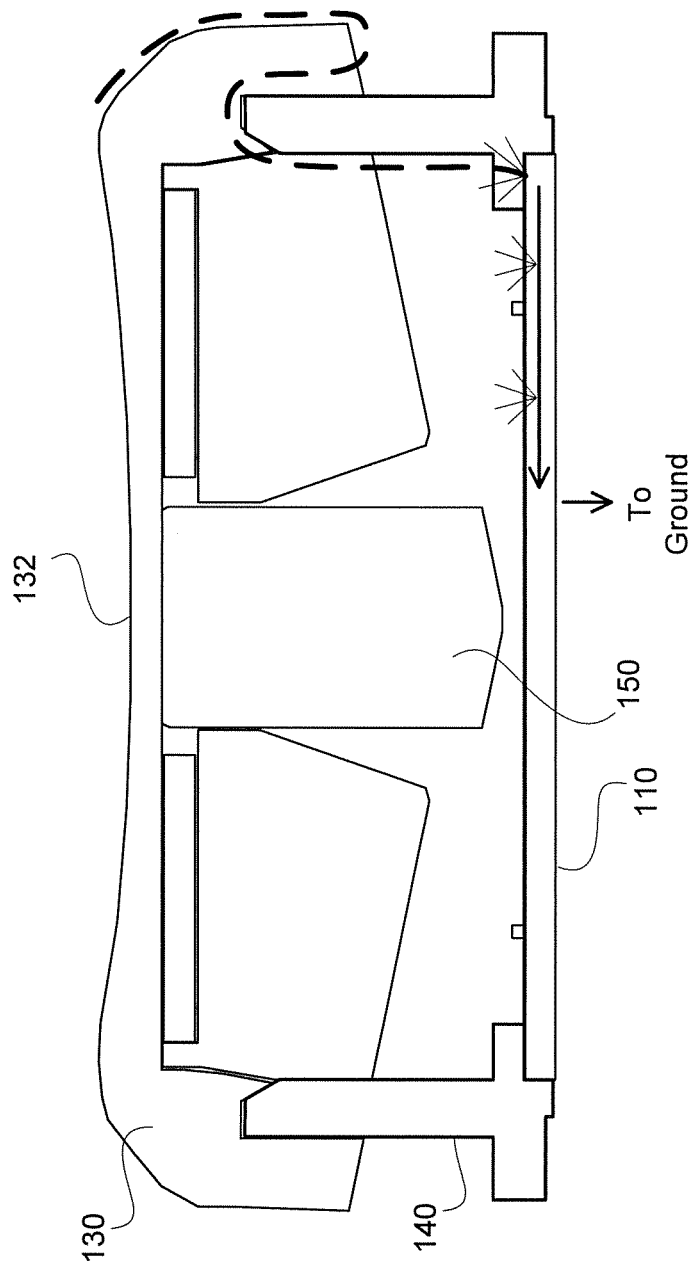
FIG. 4 is an illustration of the path that an ESD will take without the ESD component included in the switch device according to FIG. 2.
Figure 5:
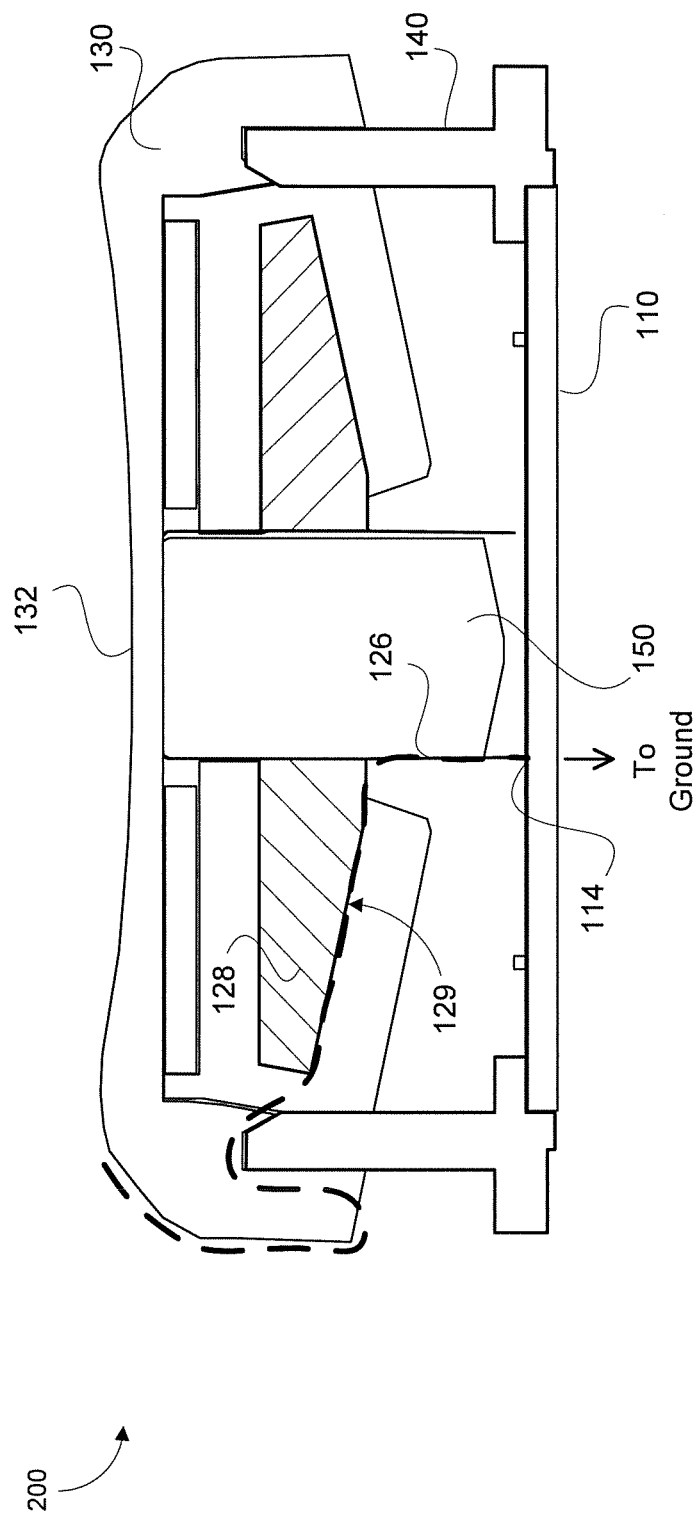
FIG. 5 is an illustration of the path that an ESD will take with the ESD component included in the switch device according to FIG. 2.

Referring now to FIGS. 4 and 5, FIG. 4 illustrates an electronic rocker switch without the use of the ESD device 120. In this instant, it can be seen that upon a person touching an upper surface of cover 130, and electro static discharge may overcome the resistance presented by the configuration of the switch. In this case, plastic is more resistive than air so the discharge would seek to move through the air in a "Z" shaped path around the side wall 134 of cover 130, up and over the edge of side wall 144 of base 140 and then in the most direct path to electrical ground. In this case, the PCB would be the closest path such that the electro static discharge would arc to the PCB. This, in turn, could cause severe damage to the sensitive electronics on the PCB as the very high voltage passed through the PCB to the ground.

A cause for this unwanted electro static discharge is due to the configuration of the switch with the PCB being positioned relatively close to the actuation surface of the switch. This close proximity lowers the resistance an arc faces to ground through the PCB. Variations in the environment and atmosphere can also have deleterious effects on the resistance to ground through the PCB. This can especially be the case in a wet, exterior environment.

Turning to FIG. 5, the same type of switch is shown, however, with the ESD device 120 installed. As can be seen, electro static discharge (shown by heavy dashed line) still occurs in the switch with the ESD device 120, however, instead of traveling through and damaging the PCB, the path of travel for the electrical current is a "Z" shaped path through the air and then it "jumps" to a distal end of arm 128 and travels to leg 126 and downward to the ground connection 114.

Therefore, by creating a path with greatly reduced resistance, the ESD device 120 can direct the discharge to a point on the PCB where no components will be damaged. The resistance of the path can be calculated by the length the arc would need to take through the air, or the (reduced) air gap plus the resistance of the metal component. The resistance of metal is significantly lower than that of air, so for the purpose of calculating the path of least resistance in current structure, only the resistance of the air gaps need be considered as the metal is effectively calculated as a zero ohm path.

A significant advantage the present configuration provides is that it allows for the PCB to be positioned very close to the top of the switch where a person would actually contact the surface of the switch to operate it. ESD protection exceeding 30 kV is provided even though there is minimal distance from the contacting surface to the PCB even in vastly differing environmental conditions. This is due to the intervening ESD device and the positioning of the legs of the ESD device relative to the same ground used by the PCB 110.

Although the invention has been described with reference to a particular arrangement of parts, features and the like, these are not intended to exhaust all possible arrangements or features, and indeed many other modifications and variations will be ascertainable to those of skill in the art.

What is claimed is:

1. An electronic device capable of capturing and directing electro-static discharge comprising:
   a printed circuit board including electronics positioned thereon and including a ground connection;
   a rocker having an actuation surface configured to be contacted to actuate the electronic device;
   an electro static discharge device comprising a frame positioned adjacent to said actuation surface, said electro static discharge device including a pair of legs extending generally perpendicular to the frame and generally parallel to each other, each leg having a proximal end coupled to the frame and a distal end that is positioned adjacent to one of a pair of ground points on said printed circuit board, each leg further including a pair of arms comprising proximal ends coupled to each leg, said arms extending generally parallel to each other and extending generally perpendicular from the legs, said arms extending along a length of said actuation surface, and wherein said electro static discharge device is spaced apart from said printed circuit board by an air gap, whereby relative pivoting movement is allowed therebetween;
   wherein said ground points on said printed circuit board are electrically connected to said ground connection;
   wherein in the event an object contacts said actuation surface and an electro static discharge occurs, the electro static discharge is drawn down at least one of the pair of legs and jumps across the air gap to at least one of the ground points on said printed circuit board.

2. The electronic device according to claim 1 wherein the ground connections for said first and second legs are provided at different locations on said printed circuit board.

3. The electronic device according to claim 1 wherein the lower edges of the pair of arms extending from the first leg are not coplanar with the lower edges of the pair of arms extending from the second leg.

4. The electronic device according to claim 1 wherein said electro static discharge device comprises a metal material.

5. The electronic device according to claim 1 wherein the proximal ends of said arms are larger than distal ends of said arms.

6. The electronic device according to claim 5 wherein said arms are configured such that each arm has an upper edge and a lower edge, wherein the upper edge is not parallel with the lower edge.

7. The electronic device according to claim 1 further comprising a base, wherein said printed circuit board is held within said base.

8. The electronic device according to claim 7 wherein said base comprises a plastic material.

9. The electronic device according to claim 7 wherein said base includes at least one side wall and at least one mounting protrusion.

10. The electronic device according to claim 7 wherein said electronic device comprises a rocker switch including an activation mechanism positioned between said actuation surface and said printed circuit board, said actuation surface comprising a first portion and a second portion such that pressing the first portion will cause a first part of said activation mechanism to pivot toward said printed circuit board and pressing the second portion will cause a second part of said activation mechanism to pivot toward said printed circuit board.

11. The electronic device according to claim 10 wherein said electro static discharge device is fitted over said activation mechanism.

12. The electronic device according to claim 10 wherein said actuation surface comprises a cover that is mechanically coupled to said base such that said activation mechanism and said electro static discharge device are sandwiched between said cover and said base.

13. An electronic rocker switch capable of capturing and directing electro-static discharge comprising:
- a printed circuit board including electronics positioned thereon;
- a base within which said printed circuit board is held;
- a cover including a rocker actuation surface and configured to be contacted to actuate the electronic switch;
- an activation mechanism positioned between said actuation surface and said printed circuit board, said actuation surface comprising a first portion and a second portion such that pressing the first portion will cause a first part of said activation mechanism to pivot toward said printed circuit board and pressing the second portion will cause a second part of said activation mechanism to pivot toward said printed circuit board;
- an electro static discharge device comprising a frame positioned adjacent to said actuation surface, said electro static discharge device including a pair of legs extending generally perpendicular to the frame and generally parallel to each other, each leg having a proximal end coupled to the frame and a distal end that is positioned adjacent to one of a pair of ground points on said printed circuit board, each leg further including a pair of arms comprising proximal ends coupled to each leg, said arms extending generally parallel to each other and extending generally perpendicular from the legs, said arms extending along a length of said actuation surface, and wherein said electro static discharge device is spaced apart from said printed circuit board by an air gap, whereby relative pivoting movement is allowed therebetween;
- wherein said ground points on said printed circuit board are electrically connected to a ground connection;
- wherein in the event an object contacts said cover and an electro static discharge occurs, the electro static discharge is drawn down at least one of the pair of legs and jumps across the air gap to at least one of the ground points on said printed circuit board.

14. The electronic rocker switch according to claim 13 wherein ground points are each provided at different locations on said printed circuit board.

15. The electronic rocker switch according to claim 13 wherein said electro static discharge device comprises a metal material.

16. The electronic device according to claim 13 wherein said base includes at least one side wall and at least one mounting protrusion.

17. The electronic rocker switch according to claim 13 wherein the pairs of arms extending from each leg extend along a length of said cover.

18. The electronic rocker switch according to claim 17 wherein the proximal ends of said arms are larger than distal ends of said arms.

19. The electronic rocker switch according to claim 18 wherein each of said arms is configured such that each arm has an upper edge and a lower edge, wherein the upper edges are not parallel with the lower edges.

* * * * *